(12) United States Patent
Shilane et al.

(10) Patent No.: US 8,918,390 B1
(45) Date of Patent: Dec. 23, 2014

(54) PREFERENTIAL SELECTION OF CANDIDATES FOR DELTA COMPRESSION

(75) Inventors: Philip N. Shilane, Yardley, PA (US);
Grant R. Wallace, Pennington, NJ (US);
Mark L. Huang, Seattle, WA (US)

(73) Assignee: EMC Corporation, Hopkinton, MA (US)

( * ) Notice: Subject to any disclaimer, the term of this patent is extended or adjusted under 35 U.S.C. 154(b) by 104 days.

(21) Appl. No.: 13/495,831

(22) Filed: Jun. 13, 2012

(51) Int. Cl.
*G06F 17/30* (2006.01)

(52) U.S. Cl.
USPC .......................................... 707/723; 707/693

(58) Field of Classification Search
CPC ....... G06F 3/061; G06F 3/064; G06F 3/0641; G06F 17/30156
USPC .................................................. 707/693, 723
See application file for complete search history.

(56) References Cited

U.S. PATENT DOCUMENTS

| | | | |
|---|---|---|---|
| 5,909,579 A | 6/1999 | Agesen et al. | |
| 6,085,263 A | 7/2000 | Sharma et al. | |
| 8,099,401 B1 * | 1/2012 | Hsu et al. | 707/705 |
| 8,140,821 B1 * | 3/2012 | Raizen et al. | 711/202 |
| 8,156,306 B1 * | 4/2012 | Raizen et al. | 711/202 |
| 8,290,972 B1 | 10/2012 | Deshmukh et al. | |
| 2003/0159145 A1 * | 8/2003 | Kaltz | 725/46 |
| 2005/0249420 A1 | 11/2005 | Takahashi | |
| 2006/0120463 A1 | 6/2006 | Wang | |
| 2007/0043789 A1 | 2/2007 | Cannon et al. | |
| 2007/0226320 A1 | 9/2007 | Hager et al. | |
| 2008/0133561 A1 | 6/2008 | Dubnicki et al. | |
| 2008/0228795 A1 | 9/2008 | Lomet | |
| 2008/0240226 A1 | 10/2008 | Okmianski et al. | |
| 2009/0019246 A1 | 1/2009 | Murase | |
| 2009/0228453 A1 * | 9/2009 | Hirsch et al. | 707/3 |
| 2010/0125553 A1 * | 5/2010 | Huang et al. | 707/661 |
| 2010/0161608 A1 | 6/2010 | Jain et al. | |
| 2010/0250855 A1 | 9/2010 | Watanabe et al. | |
| 2011/0107052 A1 * | 5/2011 | Narayanasamy | 711/171 |
| 2011/0167096 A1 | 7/2011 | Guo et al. | |
| 2011/0196829 A1 | 8/2011 | Vickrey et al. | |
| 2011/0196838 A1 | 8/2011 | Zunger et al. | |
| 2011/0264870 A1 | 10/2011 | Ylonen | |
| 2011/0276781 A1 | 11/2011 | Sengupta et al. | |
| 2012/0047284 A1 | 2/2012 | Tarkoma | |
| 2012/0124105 A1 | 5/2012 | Provenzano | |
| 2012/0137061 A1 | 5/2012 | Yang et al. | |
| 2012/0233417 A1 | 9/2012 | Kalach et al. | |
| 2013/0018851 A1 | 1/2013 | Jayaraman et al. | |

OTHER PUBLICATIONS

Notice of Allowance, U.S. Appl. No. 13/495,868, dated Feb. 25, 2014. 17 pages.

(Continued)

*Primary Examiner* — Yuk Ting Choi
(74) *Attorney, Agent, or Firm* — Blakely, Sokoloff, Taylor & Zafman, LLP

(57) ABSTRACT

A computer-implemented method and system for improving efficiency in a delta compression process in a data storage system selects a data chunk to delta compress and generates a sketch for the selected data chunk. The method and system search for a set of candidate data chunks with a matching sketch and rank the set of candidate data chunks by degree of sketch matching. The set of candidate data chunks are tie-braked using location status data for each candidate and the selected data chunk is delta compressed with a selected candidate data chunk. The delta compressed selected data chunk is then stored in a data storage system.

14 Claims, 16 Drawing Sheets

(56) References Cited

OTHER PUBLICATIONS

Non-Final Office Action, U.S. Appl. No. 13/495,881, dated Mar. 14, 2014. 12 pages.
Non-Final Office Action, U.S. Appl. No. 13/495,893, dated Mar. 21, 2014. 12 pages.
Non-Final Office Action, U.S. Appl. No. 13/495,795, dated Mar. 24, 2014. 11 pages.
Burns, et al. "Efficient Distributed Backup with Delta Compression." *Proceedings of The 1997 I/O in Parallel and Distributed Systems.* (1997). 11 pages.
Shilane, et al. "Delta Compressed and Deduplicated Storage Using Stream-Informed Locality," *HotStorage'12: Proceedings of the 4th USENIX Workshop on Hot Topics in Storage and File Systems.* (Jun. 13, 2012). 5 pages.
Shilane, et al., "WAN Optimized Replication of Backup Datasets Using Stream-Informed Delta Compression." *FAST '12: Proceedings of the 10th USENIX Conference on File and Storage Technologies.* (Feb. 2012). 15 pages.
Final Office Action, U.S. Appl. No. 13/495,795, dated Jul. 25, 2014. 14 pages.
Final Office Action in U.S. Appl. No. 13/495,881 mailed May 15, 2014. 15 pages.
Final Office Action, U.S. Appl. No. 13/495,893, dated Aug. 13, 2014. 15 pages.
Non-Final Office Action, U.S. Appl. No. 13/495,881, dated Aug. 25, 2014. 17 pages.
Non-Final Office Action, U.S. Appl. No. 13/495,926, dated Sep. 17, 2014, 17 pages.
Notice of Allowance, U.S. Appl. No. 13/495,893, dated Oct. 17, 2014, 8 pages.
Non-Final Office Action, U.S. Appl. No. 13/495,859, dated Oct. 22, 2014, 18 pages.

\* cited by examiner

PREFERENTIAL SELECTION OF CANDIDATES FOR DELTA COMPRESSION

RELATED APPLICATIONS

This application is related to a co-pending application entitled "PREFETCH DATA NEEDED IN THE NEAR FUTURE FOR DELTA COMPRESSION," Ser. No. 13/495,795, filed Jun. 13, 2012. This application is related to a co-pending application entitled "METHOD FOR CLEANING A DELTA STORAGE SYSTEM," Ser. No. 13/495,881, filed Jun. 13, 2012. This application is related to a co-pending application entitled "DEDUPLICATION USING SUB-CHUNK FINGERPRINTS," Ser. No. 13/495,856, filed Jun. 13, 2012. This application is related to a co-pending application entitled "PREFERENTIAL SELECTION OF CANDIDATES FOR DELTA COMPRESSION," Ser. No. 13/495,859, filed Jun. 13, 2012. This application is related to a co-pending application entitled "PREFERENTIAL SELECTION OF CANDIDATES FOR DELTA COMPRESSION," Ser. No. 13/495,868, filed Jun. 13, 2012. This application is related to a co-pending application entitled "METHOD FOR CLEANING A DELTA STORAGE SYSTEM," Ser. No. 13/495,893, filed Jun. 13, 2012. This application is related to a co-pending application entitled "METHOD FOR CLEANING A DELTA STORAGE SYSTEM," Ser. No. 13/495,926, filed Jun. 13, 2012.

FIELD OF THE INVENTION

Embodiments of the present invention relate generally to data storage systems. More particularly, embodiments of the invention relate to methods and systems for improved delta compression management.

BACKGROUND

Many companies and individuals with large amounts of stored data employ a backup data storage system. These backup data storage systems can be located local to the data to be backed up or at a remote site. The backup data storage systems can be managed by the entity controlling the primary data storage devices or a backup data storage service company. Data can be backed up at any frequency and any amount of data can be backed up. The backed up data can be retrieved in the case of a failure of a primary storage device from the backup data storage system. Where the backup is managed by a service company the data of many separate clients of the backup service can be backed up into the backup data storage system.

Compression of data before storage is widespread within the backup storage service market. Delta compression is a particular type of compression that is applied in this field. The basic idea of delta compression is to divide incoming data into smaller units called data chunks, generate a resemblance hash over the data chunk (this hash result is referred to herein as a "sketch"), and check the sketch against an index of previously stored data chunks. A sketch can be generated by identifying "features" of a data chunk that would not likely change even as small variations are introduced into the data chunk. In one example embodiment, a rolling hash function (e.g., to generate a Rabin fingerprint) is applied over all overlapping small regions of the data chunk (e.g., a 32 byte window) and the features are selected from maximal hash values generated in the process. This can be done with multiple hash functions to generate any number of features (e.g., generating four features). These features can be further processed to generate "super features," which can be generated by the application of a hashing function over the feature values. While features are described herein as being used for similarity matching, one skilled in the art would understand that super features can also be used for this purpose and are considered herein as a subset of the use of features and feature matching.

Data chunks with identical or similar sketches are considered for delta compression, while sketches that are not found in the index cause the corresponding data chunk to be stored and the sketch added to the index. In this way only a sub-set of the data chunks need to be stored in their entirety. For each data chunk with a matched sketch the system encodes a data chunk as a reference to the similar data chunk (i.e., the data chunk with the matching sketch) and a difference or change in the data chunk being compressed relative to the similar data chunk. In this way, only the original data chunk and a difference (i.e., the delta) between the two similar data chunks are stored rather than two entire data chunks, thereby reducing the amount of data that must be stored significantly.

Each of the data chunks also has a secured hash executed over it to generate a result that is referred to herein as a "fingerprint." The fingerprint can be utilized to identify a specific data chunk. The data chunks can be portions of a file. The file has a recipe for reconstruction, which consists of a list of fingerprints and related information corresponding to the chunks stored in the backup data storage system. For backup data storage systems, the typical backup cycle consists of daily or weekly full backups of a primary data storage system, so most of the data stored in the backup data storage system is repeated (i.e., a duplicate) or has minor alterations. These minor alterations can be effectively delta compressed to avoid having to store significant amounts of data.

Delta compression also has applicability to data transmission where instead of minimizing an amount of data storage space that is required, the delta compression seeks to minimize the amount of data that must be transmitted thereby reducing bandwidth requirements. The delta compress transmission process works in a similar manner to that of the delta compression for storage, except that instead of storing the delta compressed data, the delta compressed data is transmitted to a receiving computer. Fingerprint data is also transmitted to the remote machine such that a fingerprint index can be maintained at the receiving machine to enable proper reconstruction of the transmitted data at the receiving machine.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
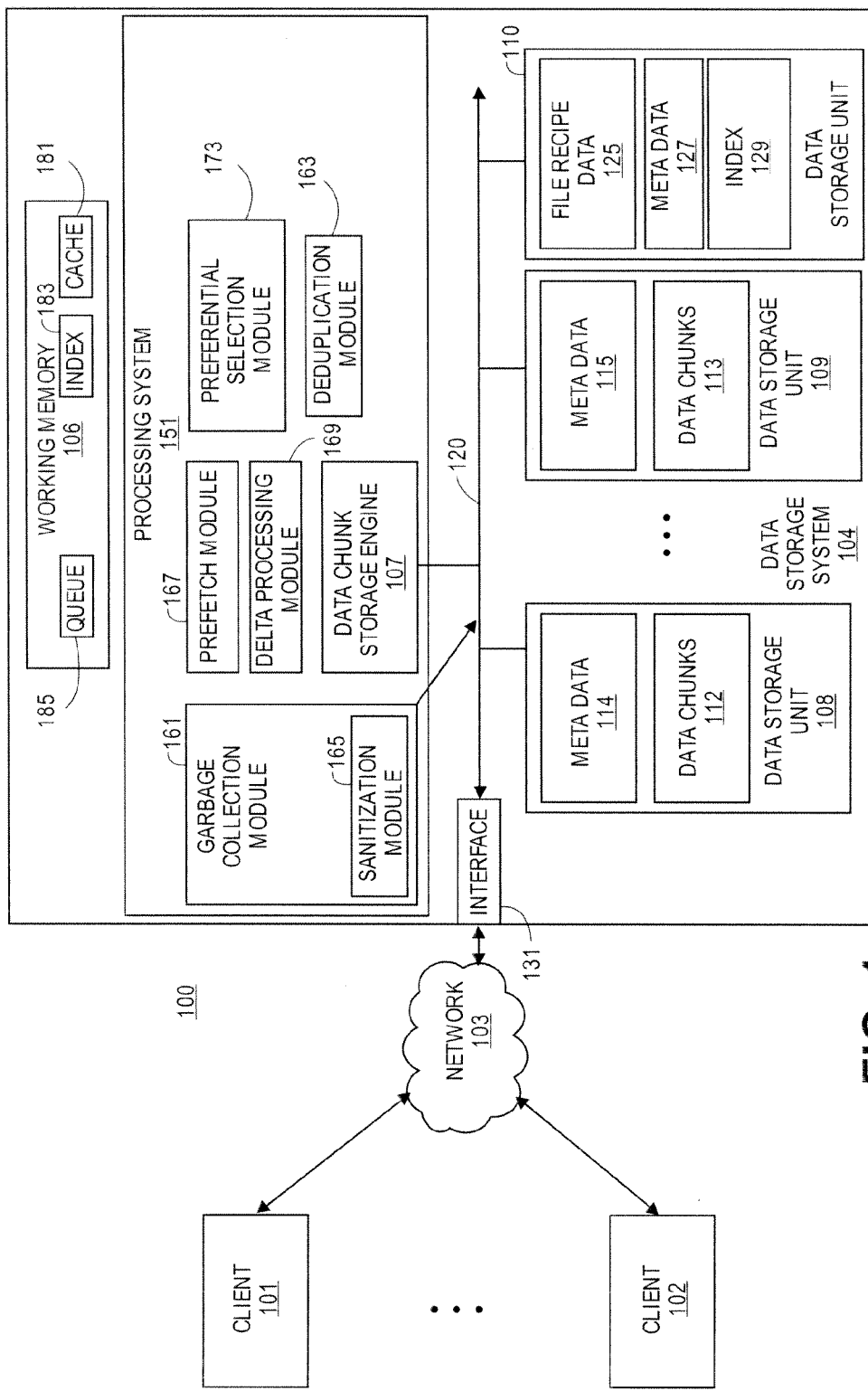
FIG. 1 is a block diagram of one embodiment of a delta compression system.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present invention.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In one embodiment, a delta compression system is a data storage system having a set of storage units. A 'set,' as used herein refers to any positive whole number of items including one item. Each of the storage units is configured to store data chunks that are delta compressed within each of the data storage units, where the files stored in the storage system are comprised of the data chunks. Each data chunk is formed through a specific policy, e.g. by breaking a file up based on properties of the content in the file, which permits changes to one data chunk without affecting the boundaries or contents of other chunks. Each data chunk is associated with a 'fingerprint' and similar metadata representing the data chunk. A fingerprint contains a metadata value (e.g., a hash value) that uniquely identifies that data object. Fingerprints can be used to identify duplicate data chunks. As used herein, this metadata is in contrast with the 'content' of the data in the files. Similarly, each data chunk is associated with a 'sketch' which is a metadata value that is generated by a resemblance hash or similar algorithm to be used to identify similar data chunks.

In other embodiments, the delta compression system is utilized to improve the efficiency of data transfer by reducing the amount of data to be transmitted and thereby reduce the bandwidth utilization or requirements of the data transfer. In these embodiments, the metadata necessary for decompressing the transmitted data is also transmitted to the recipient device along with the compressed data chunks. This can include fingerprint information and similar information to enable the construction of an index at the recipient device to identify base chunks referenced by delta chunks and similar relationships necessary for reconstruction of a data set. A 'base chunk,' as used herein refers to a data chunk that is utilized as a baseline for delta compression, where the difference between the data chunk serving as the base chunk and the data chunk being delta compressed is referred to herein as the 'delta.' The delta can be stored in place of the complete data chunk along with a 'delta reference' that identifies the base chunk.

The system and processes described herein efficiently delta compress a set of data chunks and manage the use of the set of data. These processes and systems include garbage collection, cache utilization and pre-fetching processes and systems. These processes and systems can be utilized separately and in any combination with one another. The delta compression processes and systems can be utilized in combination with other data storage and transmission systems and processes such as data deduplication processes and systems. One skilled in the art would understand that the delta compression processes and systems are not dependent on these additional systems and can be utilized without them. Rather, other systems are presented by way of example and not by way of limitation to demonstrate the inter-compatibility of the delta compression processes and systems.

FIG. 1 is a diagram of one embodiment of a data storage system and a network of associated machines. Referring to FIG. 1, the system 100 includes, but is not limited to, one or more client systems 101, 102 communicatively coupled to delta compression system 104 over network 103. Clients 101, 102 can be any type of computing devices such as a server, a personal computer (e.g., desktops, laptops, and tablets), a "thin" client, a personal digital assistant (PDA), a Web enabled appliance, a gaming device, a media player, or a mobile phone (e.g., Smartphone), or similar computing device. Network 103 can be any type of network such as a local art network (LAN), a wide area network (WAN) such as the Internet, a corporate intranet, metropolitan area network (MAN), a storage area network (SAN), a bus, or a combination thereof, where constituent devices within the networks communicate over any combination of wired and/or wireless transport mediums. The clients 101, 102 transmit data to or receive data from the delta compression system 104 over the network 103.

Delta compression system 104 can include any type of individual computing device, server or cluster of servers. For example, delta compression system 104 can be a storage server used for any of various different purposes, such as to provide multiple users with access to shared data and/or to back up mission critical data. In another example, the delta compression system can be a file server that compresses large files for transmission to clients 101, 102. Delta compression system 104 can be, for example, a file server (e.g., an appliance used to provide network attached storage (NAS) capability), a block-based data storage server (e.g., used to provide storage area network (SAN) capability), a unified data storage device (e.g., one which combines NAS and SAN capabilities), a nearline data storage device, a direct attached storage (DAS) device, a tape backup device, or any other type of data storage device. Delta compression system 104 can have a distributed architecture, or all of its components can be integrated into a single unit. In one embodiment, delta compression system 104 can be implemented as part of an archive and/or backup system such as a data storage system available from EMC® Corporation of Hopkinton, Mass.

In one embodiment, delta compression system 104 includes, but is not limited to including a set of data storage units 108, 109, 110, processing system 151, working memory 106 interconnect 120, interface 131 and similar components. The processing system 151 can include a set of processing devices for processing and managing data within the delta compression system 104. The working memory 106 is used by the processing system 151 to manipulate data and execute instructions. In one embodiment, the processing system 151 executes instructions to implement the garbage collection module 161, deduplication module 163, sanitization module 165, pre-fetch module 167, delta processing module 169, data chunk storage engine 107, preferential selection module 173 and similar components and uses the working memory 106 in this process. The working memory 106 can include a cache 181 to store frequently used data, an index 183 or portion of an index that correlates data chunks to storage locations and a queue 185 that can be utilized to store data chunks or references to data chunks stored in other locations that are scheduled for delta compression processing or similar functions.

The garbage collection module 161, deduplication module 163, sanitization module 165, pre-fetch module 167, delta processing module 169, data chunk storage engine 107, preferential selection module 173, data storage units 108, 109, 110, and similar components are communicatively coupled to one another in the processing system 151 and working memory 106. Data storage units 108, 109, 110 can be implemented locally (e.g., single node operating environment) or remotely (e.g., multi-node operating environment) via interconnect 120, which may be a bus or a network.

A delta compression module 169 receives or retrieves a set of data chunks that are to be delta compressed. The delta compression process is generally described below in regard to FIG. 2. The delta compression module 169 identifies data chunks by generating a fingerprint and/or a sketch for each data chunk as it is being processed (if not already created by other components). A data chunk being processed in this manner is referred to herein as a selected data chunk, in that the data chunk has been selected to be processed. The sketch is matched against sketches of previously processed data chunks using an index 129 or similar metadata source. A data chunk with a matching sketch or similar sketch to the sketch of the selected data chunk can be selected to serve as a 'base' chunk. The base chunk is already stored and will be maintained for reference. The selected data chunk is then reduced to a representation of the differences between the selected data chunk and the base chunk. This difference or 'delta' is stored along with a reference to the base chunk, which is referred to herein as a delta reference. Storing and/or transmitting a delta and a delta reference require fewer resources than storing or transmitting the entire data chunk.

The selection of a base chunk can be influenced by more than just a matching sketch. A preferential selection module 173 can work in coordination with the delta processing module 169 to select a base chunk. The criteria for selecting the base chunk can include both the similarity of the base chunk to the selected data chunk (e.g., based on the number of matching features between the sketches) and the current location and status of the base chunk. The base chunk could be located in different storage locations that have varying access times. For example the base chunk could be in a cache 181 in the working memory or in the data chunk areas 112, 113 of the data storage unit 108, 109, 110. The access times for a cache can be significantly less than those of a data storage unit 108, 109, 110. The base chunk could also be in a compressed state or other state that requires processing to access the base chunk. The preferential selection module 173 identifies a set of candidate data chunks and based on its configuration selects a base chunk from this set of candidate data chunks in light of access times and desired level of compression. This process is discussed in further detail herein below in regard to FIGS. 12-14.

A pre-fetch module 167 seeks to load data chunks into a cache 181, working memory 106 or similar location with faster access times in anticipation that these data chunks are likely to be utilized by other processes such as the delta compression process or the deduplication process. The pre-fetch module 167 analyzes selected data chunks and base chunks and attempts to identify similar data chunks to load into the cache 181. The pre-fetch module 167 can identify a set of similarity data using various methods including sketches, addresses, containers and similar metadata related to selected data chunks and/or base chunks. The pre-fetch module 167 then seeks to load those data chunks in data storage units 108, 109, 110 or similar locations with slow access times into a cache 181 or similar location with a faster access time. The pre-fetch process is described in further detail herein below in regard to FIG. 11.

A deduplication module 163 can work in coordination with other components to reduce the number of data chunks that need to be stored or transmitted. The deduplication module finds duplicate data chunks by using fingerprints of each data chunks to identify duplicate data chunks. These duplicate data chunks can then be removed to reduce storage and bandwidth requirements. The deduplication module 163 can also execute the sub-chunk deduplication process described herein below with regard to FIGS. 15-17. In other embodiments, the sub-chunk deduplication process can be executed by the delta compression module 169, other modules or any combination thereof.

The garbage collection module 161 traverses the data storage units 108, 109, 110 to find 'dead' data chunks that are data chunks that are no longer referenced by any file recipes in the delta compression system 104 or by any data chunks that have been delta compressed. The garbage collection process is discussed in further detail herein below in reference to FIGS. 3-9. The garbage collection module 161 can run asynchronous to any delta-compression processes or deduplication processes and preserves the data that is necessary for their efficient and correct operation.

A sanitization module 165 can be a component of the garbage collection module 161 or a separate component. The sanitization module 165 ensures that sensitive data is deleted when intended and that the delta compression does not preserve sensitive data that is designated for deletion. The process identifies each data chunk of a file that is designated for deletion. If some of these data chunks serve as base chunks for other delta encoded data chunks then under normal circumstances these data chunks may not be deleted. However, due to requirements for the complete deletion of some sensitive files, the sanitization module 165 identifies the delta referencing data chunks and decodes them or alters their delta references to a new base chunk thereby allowing deletion of the data chunk of the file to be deleted without causing any loss of data for those referencing delta encoded data chunks. This process is described in further detail in reference to FIG. 10.

In one embodiment, one of the data storage units 108, 109, 110 operates as an active storage to receive and store external or recently received user data, while the other data storage unit operates as a secondary data storage unit to periodically archive data from the active storage unit according to an archiving policy or scheme. Data storage units 108, 109, 110 can be, for example, conventional magnetic disks, optical disks such as CD-ROM or DVD based storage, magnetic tape storage, magneto-optical (MO) storage media, solid state disks, flash memory based devices, or any other type of nonvolatile storage devices suitable for storing large volumes of data. Data storage units 108, 109, 110 can also be combinations of such devices. In the case of disk storage media, the data storage units 108, 109, 110 can be organized into one or more volumes of Redundant Array of Inexpensive Disks (RAIDs).

In response to a data file being received to be stored in data storage units 108, 109, 110 data chunk storage engine 107 is configured to divide (or segment) the data file into multiple data chunks according to a variety of data division policies or rules. In one embodiment, data chunk storage engine 107 in coordination with the deduplication module 163 and delta processing module 169 only stores a chunk in a data storage unit if the data chunk has not been previously stored in the storage unit. In the event that a data chunk has been previously stored, metadata information is stored enabling the reconstruction of a file using the previously stored data chunk. As a result, chunks of data files are stored in a deduplicated and/or delta compressed manner, either within each of data storage units 108, 109, 110 or across at least some of the data storage units 108, 109, 110. In addition, metadata is added to at least some of data storage units 108, 109, 110 such that files can be accessed independent of another storage unit. Data stored in the data storage units can be stored in a compressed form (e.g., lossless compression: Huffman coding, Lempel-Ziv Welch coding; delta encoding, i.e., a reference to a data chunk plus a difference (a 'delta')). In one embodiment, different data storage units can use different compressions (e.g., main or active data storage unit 108 using a different compression from other data storage units, one storage unit from another storage unit, or similar variations). Also, different chunks can use different compressions in any combination or configuration.

Data chunks and metadata can also be further organized into a set of containers. Containers are logical units of storage within the physical data storage units 108, 109, 110. Containers can be structured such that entire containers of data chunks and/or meta data can be retrieved at one time and stored in working memory or similar faster access location.

In a further embodiment, the data chunks can be further sub-divided into sub-chunks. Sub-chunk deduplication can then be employed to further reduce duplication by dividing data into smaller chunks. The principles and features described herein in relation to chunks would be understood by one skilled in the art to be generally applicable to sub-chunks as well.

In one embodiment, the metadata 114, 115, 127 information includes a file name, a storage unit where the data chunks associated with the file name are stored, reconstruction information for the file using the data chunks, data chunk type, local compression size, sub-chunk sizes, fingerprint, data chunk hashes, data chunk resemblance hashes for delta encoding, disk location, sketches, container information and any other appropriate metadata information. In one embodiment, a copy of the metadata is stored on a particular storage unit for files stored on that storage unit so that files that are stored on the storage unit can be accessed using only the metadata stored on the data storage unit. In one embodiment, a main set of metadata information can be reconstructed by using information of other data storage units associated with the storage system in the event that the main metadata is lost, corrupted, damaged, or similarly unavailable. Metadata for data storage unit can be reconstructed using metadata information stored on an active data storage unit or other storage unit (e.g., replica storage unit).

Metadata information further includes index information 129 (e.g., location information for chunks in storage units). The index can include entries for each data chunk and/or sub-chunk stored or managed by the delta compression system 104. Portions 183 of the index information 129 can be loaded into the working memory that are related to a set of data chunks being processed. The index 129 is generally too large to be entirely loaded into the working memory 106. The index 129 can be partially loaded on a container by container basis or similar grouping of index entries. The loading of this index information can be handled in a manner similar to that of the corresponding data chunks with regard to pre-fetching processes.

In one embodiment, wherein the delta compression system serves as a data storage system, the data storage system can be used as a tier of storage in a storage hierarchy that comprises other tiers of storage. One or more tiers of storage in this hierarchy can utilize different kinds of storage devices and/or can be optimized for different characteristics such as random update performance. Files are periodically moved among the tiers based on data management policies to achieve a cost-effective match to the current storage requirements of the files. For example, a file can initially be stored in a tier of storage that offers high performance for reads and writes. As the file ages, it may be moved into a tier of storage according to this invention. In various embodiments, tiers include different storage technologies (e.g. tape, hard drives, semiconductor-based memories, optical drives, etc.), different locations (e.g., local computer storage, local network storage, remote network storage, distributed storage, cloud storage, archive storage, vault storage, etc.), or any other appropriate storage for a tiered data storage system.

Metadata 114, 115 and 127 can include a fingerprint and/or a sketch of a data chunk. In one embodiment, a fingerprint may include a hash value computed based on the data chunk using a variety of hash algorithms, such as SHA-1 or message digest 5 (MD5) hash algorithms. Alternatively, metadata can include a sketch determined from the corresponding data chunk using any one of a variety of methods. Sketch generation involves generating a value from a data chunk that is an approximate identifier of the data chunk such that the value would also identify similar data chunks. The sketches can be generated by use of a resemblance hash function or similar function.

Note that throughout this application, a data storage system is utilized as an example application of a delta compression system. However, the techniques described throughout this application can also be applied to other types of system including those that utilize delta compression for data transmission. Also note that fingerprints and sketches are utilized as examples of metadata, however, other types of data such as a feature, signature, or pattern of data can also be applied. If data are transformed by filtering portions of content, the transformed data and metadata therein will be distinct from the fingerprint used for delta compression and will be computed and stored separately.

In one embodiment, a given data storage unit 110 can store file recipe data 129, metadata 127 and an index 129. In other embodiments, this data is distributed over all of the data storage units 108, 109, 110. The file recipe data 125 contains the information necessary to reconstruct a stored file in the data storage units 108, 109. The file recipe 125 includes fingerprints or similar identifiers of each of the data chunks that make up the file. These can be used to retrieve or generate the corresponding data chunk to form the file. The file recipe 125 can also include additional data including delta referencing data that identifies the data chunks that other data chunks rely upon as base chunks for their delta compression.

The index 129 is a data structure that correlates data chunks with their location in the data storage units 108, 109. Each index entry can also include metadata about the data chunks including their fingerprints, sketches, delta references, container information and similar information. The index 129 is utilized to locate data chunks in the data storage units 108, 109. The data chunks 112, 113 can be organized in any manner within the data storage units 108, 109. In one embodiment, the data chunks 112, 113 are organized in sets referred to as containers. Metadata for the data chunks can then be container specific. Data chunks 112, 113 can be organized into containers or similar structures based on similarity, stream order, file organization or similar criteria.

Figure 2:
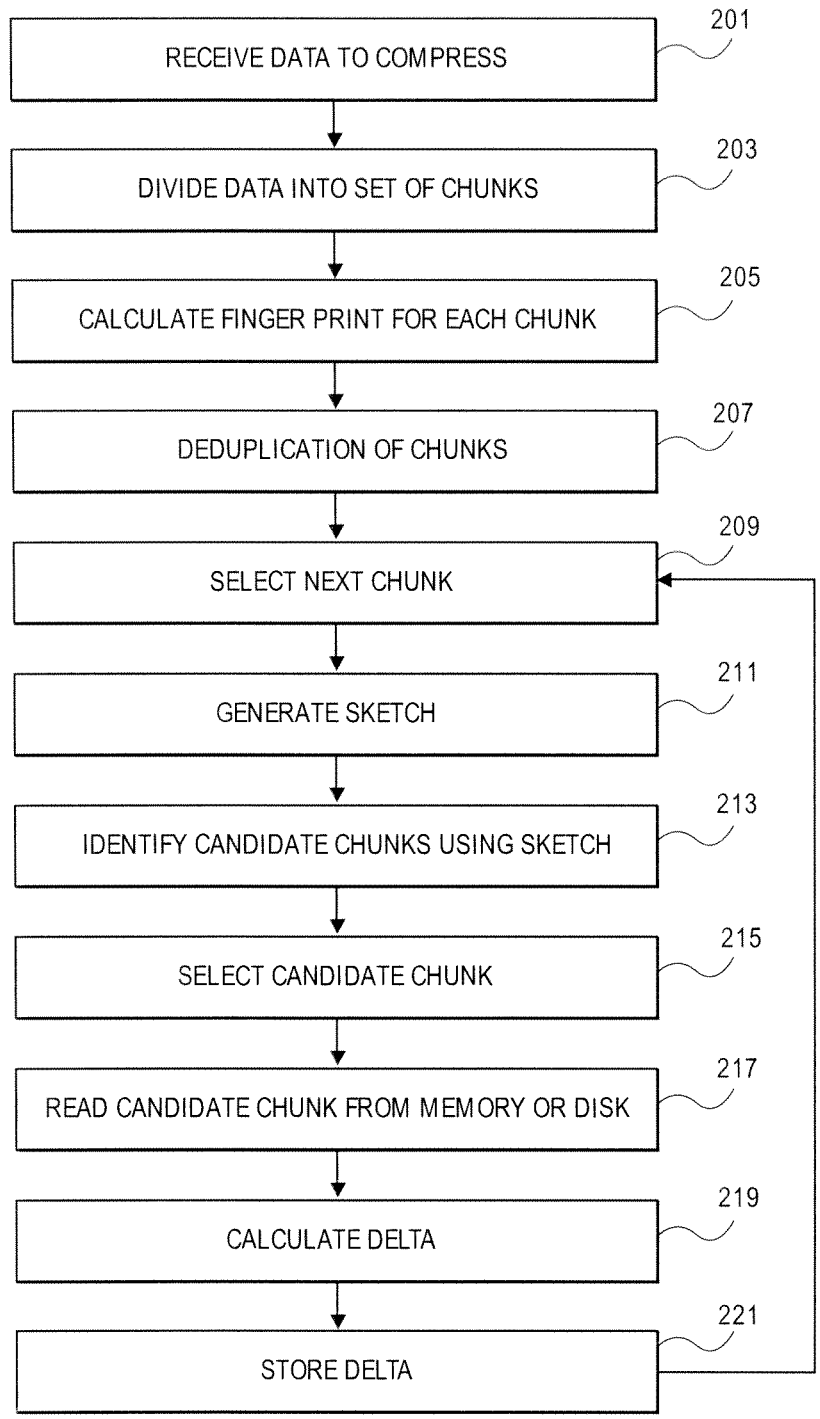
FIG. 2 is a flowchart of one embodiment of a delta compression process.

FIG. 2 is a flowchart of one embodiment of a delta compression process. In one embodiment, the delta compression process is initiated in response receiving data to be compressed (Block 201). The data can be received from external or internal sources for backup, transmission, or similar compression scenarios. In other embodiments, the delta compression is initiated and the process is directed to or accesses local or remote data to be processed. The data set is divided into a set of data chunks (Block 203). The data chunks can have a size such as 4 kb or 8 kb as designated by an administrator, configuration information or default settings. In one embodiment, the data chunks have a fixed regular and uniform size. In other embodiments, the data chunks can have variable sizes.

For each data chunk in the set of data a fingerprint is calculated (Block 205). A fingerprint can be generated by a secure hashing algorithm or similar function such that the fingerprint uniquely identifies the data chunk. The fingerprint can have a size proportionate to the number of unique data chunks that must be identified and the acceptable probability that a collision occurs where two different data chunks have the same fingerprint, for example the fingerprint could be 20 bytes for a 4 kb data chunk within a petabyte storage system.

The fingerprints can be utilized to deduplicate the data chunks in the set of data (Block 207). Each data chunk with an identical fingerprint to a previously processed data chunk can be discarded and a reference to the other data chunk utilized in its place in the storage or transmission of the data set. This enables a single instance of a data chunk to represent all other instances of that data chunk in the data set providing considerable resource savings in space or bandwidth. The deduplication process is optional in a delta compression system.

The delta compression continues by selecting a next chunk in a stream or queue of data chunks to process serially or in parallel (Block 209). The selected data chunk is analyzed to generate similarity information that will enable the identification of other data chunks with similar data. In one embodiment, this is accomplished by generating a sketch using a resemblance hash or similar function executed over the data chunk (Block 211). The sketch is utilized to identify a set of candidate chunks to serve as a base chunk for the currently selected chunk (Block 213). The sketch can be utilized to find matching or similar sketches associated with previously processed data chunks. An optimum data chunk can then be selected from these candidates to utilize as a base chunk in performing a delta compression of the selected data chunk (Block 215). The base chunk is then read from its storage location such as the cache, memory or data storage (Block 217).

The base chunk is compared with the selected chunk to identify differences in the data content and data organization. This differing or 'delta' information is preserved, or a means of recreating these differences based on modifying the base chunk is preserved, as delta information (Block 219). The delta information is then stored along with a reference to the base chunk to enable decoding and reconstruction of the selected data chunk (Block 221).

This process is provided by way of example. The processes that follow seek to improve upon the basic process for delta processing. One skilled in the art would understand that any one of or any combination of the processes described herein could be utilized to improve the efficiency, compression and/or resource usage of the delta compression system over the basic delta compression process.

Figure 3:
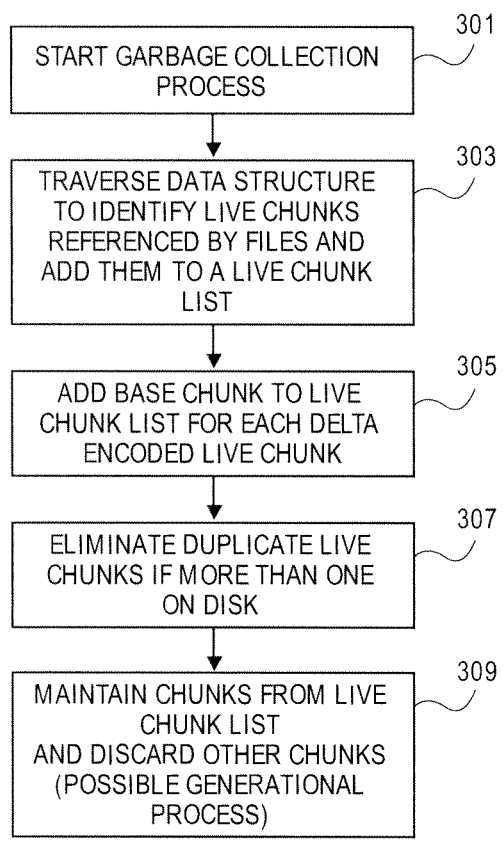
FIG. 3 is a flowchart of one embodiment of a garbage collection process.

FIG. 3 is a flowchart of one embodiment of a garbage collection process. In one embodiment, the garbage collection process can be initiated at any time asynchronous to any delta compression process (Block 301). The garbage collection process can be executed on a set of data storage units storing a set of data chunks in containers or similar data structures. These data chunks can be part of a data backup system, data transmission system or similar data management system where delta compression is applicable. The garbage collection process can be run during offline times or low system usage times for the delta compression system to minimize any impact on the usage of the delta compression system. In other embodiments, separate hardware or machines execute the garbage collection process to minimize the impact on the hardware or machines utilized by the delta compression system.

The garbage collection process traverses the data structure containing the data chunks themselves or the metadata of the data chunks to identify each live data chunk that is referenced by a valid or active file managed by the delta compression system (Block 303). In one embodiment, the files are tracked as a set of file recipes, which identify each of the data chunks that constitute a particular file. Thus, each file recipe is traversed and each of the data chunks referenced by the file recipe is added to a live chunk list.

Some of the data chunks that make up each of these files can be stored as a delta encoded data chunk. For each data chunk in the file recipe that refers to a delta encoded data chunk, the corresponding base chunk must also be preserved and is added to the live chunk list. The base chunk can be determined by looking up a delta reference in the file recipe, file metadata or the index. Each of these scenarios is discussed further herein below in relation to FIGS. 4-6.

Optionally each live data chunk that is repeated in the live chunk list can be deduplicated through a deduplication process that replaces duplicate live chunks with references to a single live chunk that is maintained (Block 307). In one embodiment, live base versions of the duplicate data chunks are maintained while delta encoded versions are discarded. In other embodiments, the deduplication process if utilized is asynchronous to the garbage collection process.

Once all of the file recipes or similar file information is traversed, then the data chunks in the live chunk list are maintained and other data chunks are discarded (Block 309). This process can be effected by copying the live data chunks to a new location, deleting the discarded data chunks in a current location or similarly reclaiming the resources of the 'dead' data chunks that did not make the live chunk list. This decision can be dynamic based on a condition of the data structure containing the data chunks such as a percentage of a container that is live where a low percentage would result in a copy of the live chunks and a high percentage would result in a deletion of the dead data chunks.

In one embodiment, the garbage collection process can be a part of a generational process where the set of data chunks is stored and maintained as a 'diff' or differential encoding of a prior version of the set of data chunks. In this embodiment, the garbage collection process must be careful to add base chunks to a live chunk list that may be in a prior version data set, making the garbage collection process compatible with the generational process for managing the data set.

Figure 4:
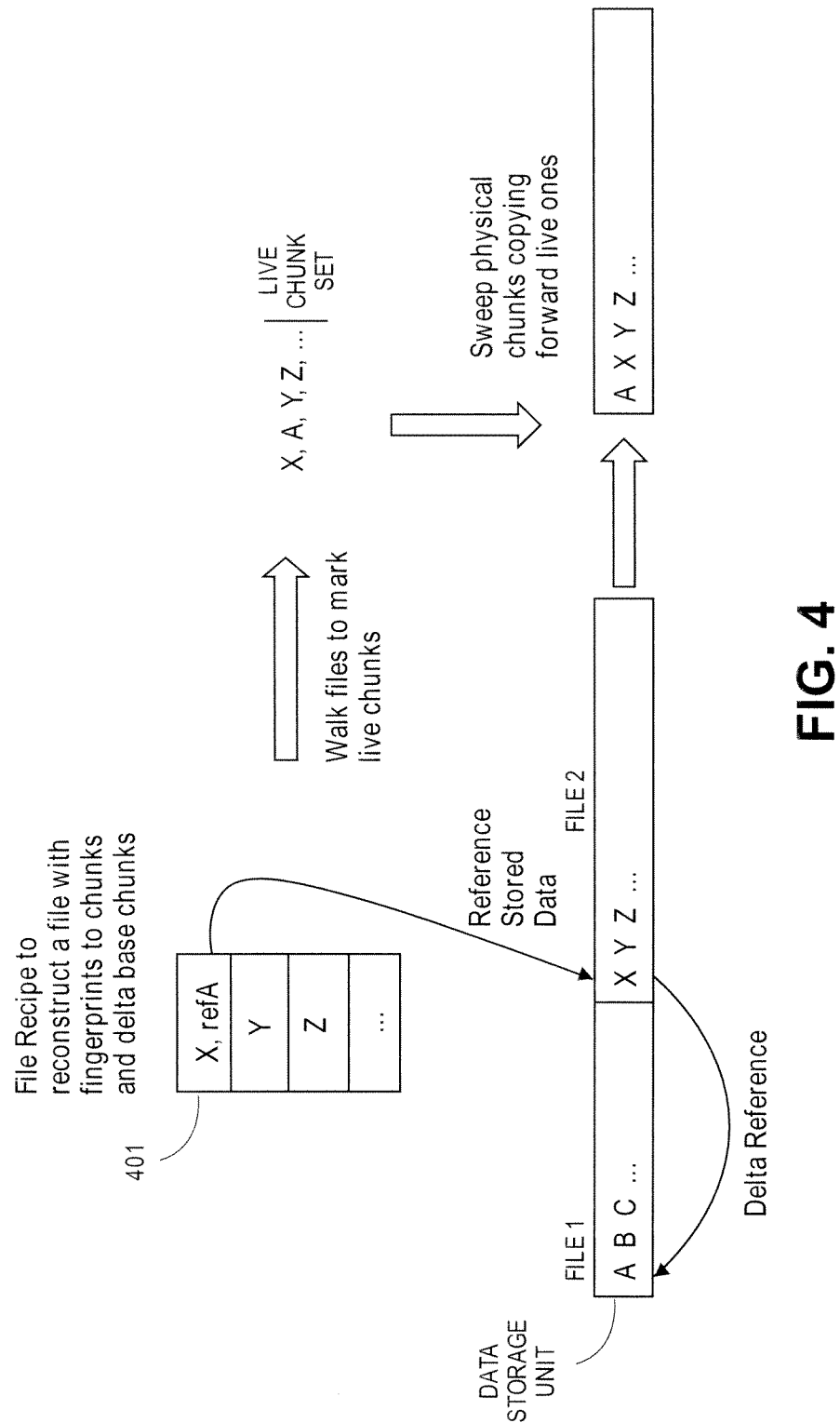
FIG. 4 is a diagram of one embodiment of a garbage collection process where references to base chunks are maintained in the file description.
Figure 7:
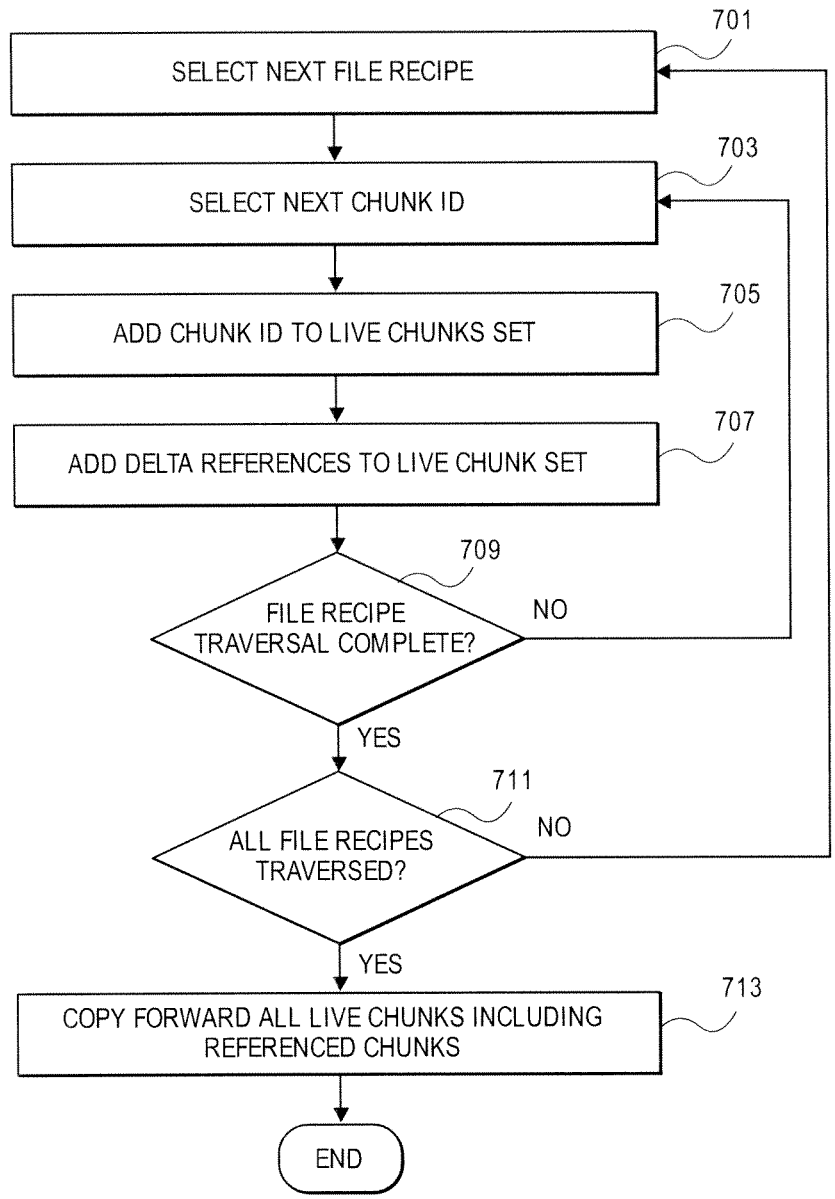
FIG. 7 is a flowchart of one embodiment of a garbage collection process where references to base chunks are maintained in the file description.

FIG. 4 is a diagram of one embodiment of a garbage collection process where references to base chunks are maintained in the file description. FIG. 7 is a flowchart of one embodiment of a garbage collection process where references to base chunks are maintained in the file description. These figures are discussed in conjunction with one another to illustrate an example application (FIG. 4) of the general process (FIG. 7).

In one example embodiment, the garbage collection process utilizes delta reference information stored in the file description also referred to herein as the file recipe. The file recipe 401 includes a list of data chunks (e.g., X, Y and Z) that form the file where each data chunk is identified by an address, fingerprint or similar information. In this embodiment, along with the identification information for each particular data chunk, a delta reference is included where the data chunk has been delta encoded. For example, the data chunk X is stored as a delta encoding that utilizes a base chunk A and the file description includes a reference to A, labeled refA.

During the garbage collection process, the garbage collection module traverses or 'walks' each file recipe by selecting a next file recipe to process (Block 701) and traversing it before or in parallel with other file recipes. The process traverses a file recipe by selecting the next data chunk identifier in the file recipe (Block 703) and adding the data chunk identifier to a live chunk list (Block 705), then adding any delta references for the data chunk to the live chunk set (Block 707). In the illustrated example, the file recipe includes references to data chunks X, Y and Z, which are each added to the live chunk set. The data chunk X is delta encoded and the delta reference is included with the file recipe information. The illustration shows that the reference to the stored data chunk X in the data storage unit references the base chunk A. The process continues until all data chunks in a file recipe have been examined (Block 709) and all file recipes have been traversed (Block 711).

The live chunk set is utilized, in the example embodiment, to copy or 'sweep' the live data chunks to a new location thereby freeing the prior data storage location (Block 713). The new storage location can utilize fewer resources if there were dead data chunks that were not copied forward with the live data chunks. This embodiment is presented by way of example and not limitation. One skilled in the art would understand that this embodiment can be used in combination with the other embodiments described herein above and below.

Figure 5:
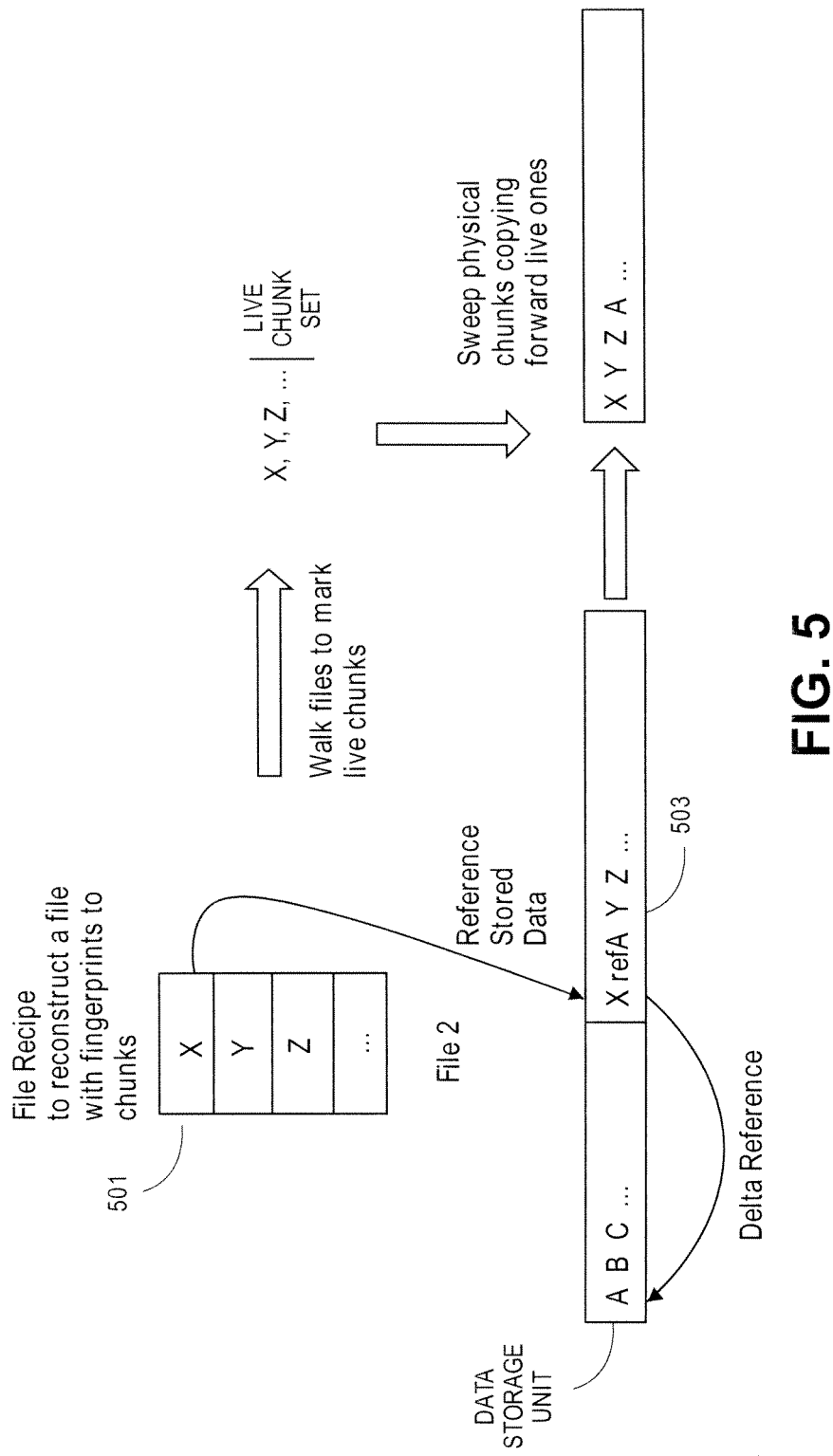
FIG. 5 is a diagram of one embodiment of a garbage collection process where references to base chunks are maintained in the metadata of a data chunk.
Figure 8:
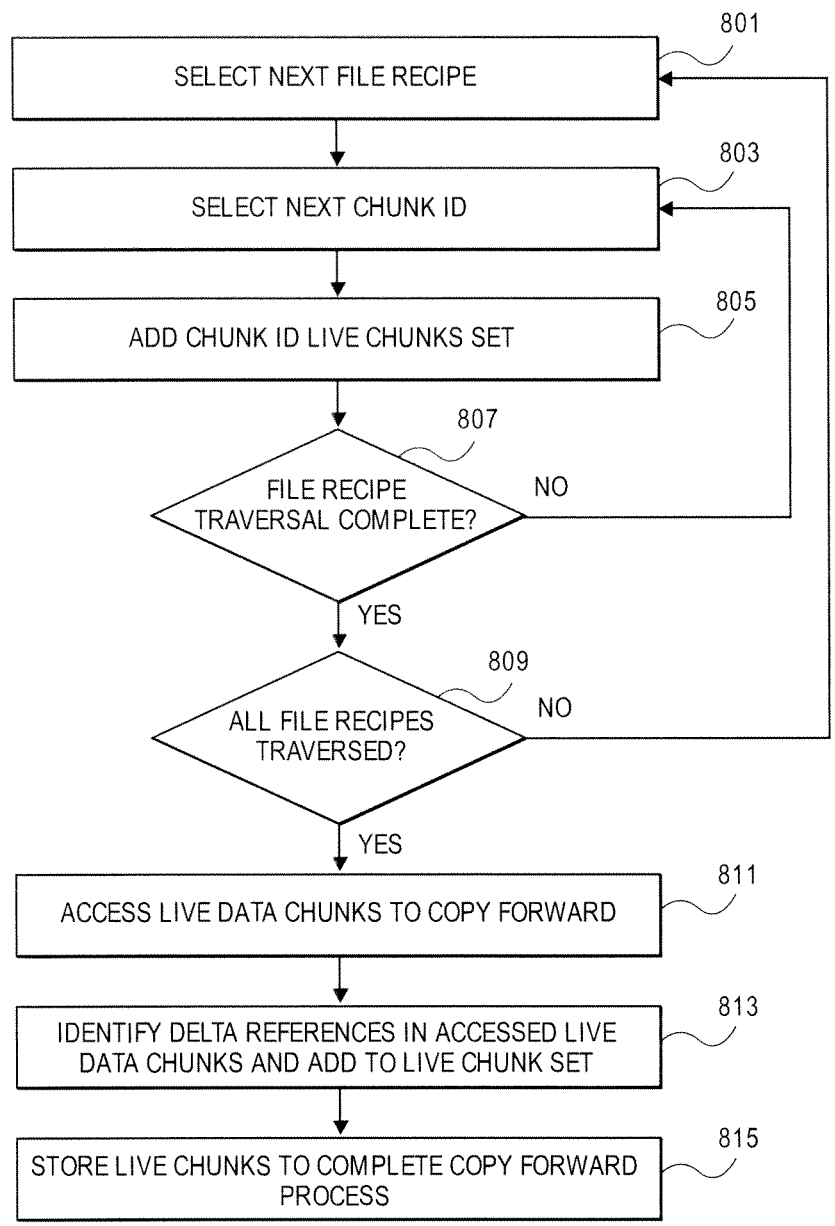
FIG. 8 is a flowchart of one embodiment of a garbage collection process where references to base chunks are maintained in the metadata of a data chunk.

FIG. 5 is a diagram of one embodiment of a garbage collection process where references to base chunks are maintained in the metadata of a data chunk. FIG. 8 is a flowchart of one embodiment of a garbage collection process where references to base chunks are maintained with the data chunk metadata. These figures are discussed in conjunction with one another to illustrate an example application (FIG. 5) of the general process (FIG. 8). In one example embodiment, the garbage collection process utilizes delta reference information stored in the data chunk metadata. The file recipe 501 includes a list of data chunks (e.g. X, Y and Z) that form the file where each data chunk is identified by an address, fingerprint or similar information. The file recipe may or may not indicate whether any data chunk is delta encoded.

During the garbage collection process, the garbage collection module traverses or 'walks' each file recipe by selecting a next file recipe to process (Block 801) and traversing it before or in parallel with other file recipes. The process traverses a file recipe by selecting the next data chunk identifier in the file recipe (Block 803) and adding the data chunk identifier to a live chunk list (Block 805). In the illustrated example, the file recipe includes references to data chunks X, Y and Z, which are each added to a live chunk set. In this example, the data chunk X is delta encoded and the delta reference is included with the data chunk metadata. In one embodiment, when the file recipe is traversed the metadata for each data chunk is examined to identify whether a delta reference is included when the data chunk has been delta encoded. For example, the data chunk X is stored as a delta encoding that utilizes a base chunk A. The illustration shows that the reference to the stored data chunk X in the data storage unit references the base chunk A. This delta reference can then added to the live chunk set. In another embodiment, described below the delta reference is determined during the copy phase. The process continues until all data chunks in a file recipe have been examined (Block 807) and all file recipes have been traversed (Block 809).

The live chunk set is utilized, in the example embodiment, to copy or 'sweep' the live data chunks to a new location thereby freeing the prior data storage location. The new storage location can utilize fewer resources if there were dead data chunks that were not copied forward with the live data chunks. In the embodiment where the delta reference is determined prior to the copy, the garbage collection process is complete.

In another embodiment, the delta-reference information is read during the access of the data chunk (Block 811) during the copy of the information to the new location. The delta reference information from the data chunk (e.g., the metadata of the data chunk) is at that time examined and any base chunks that are not part of the live chunk set are added to be copied as well (Block 813). In one embodiment, in the access phase, the delta references can be collected in a separate traversal of the data chunks from the copying traversal. For example, all containers can be traversed to identify all delta references in each container including those that reference a data chunk in another container. This avoids a scenario where a data chunk in a particular container appears to be dead, because no references to the data chunk were found in the container (assuming a container by container traversal). However, a reference to the data chunk could exist in another container.

The process of copying the data forward continues until all of the data chunks listed in the lives chunk set are copied to the new location (Block 815) including those delta references added during this process (i.e., encompassing single and multiple traversal embodiments). This embodiment is presented by way of example and not limitation. One skilled in the art would understand that this embodiment can be used in combination with the other embodiments described herein above and below.

Figure 6:
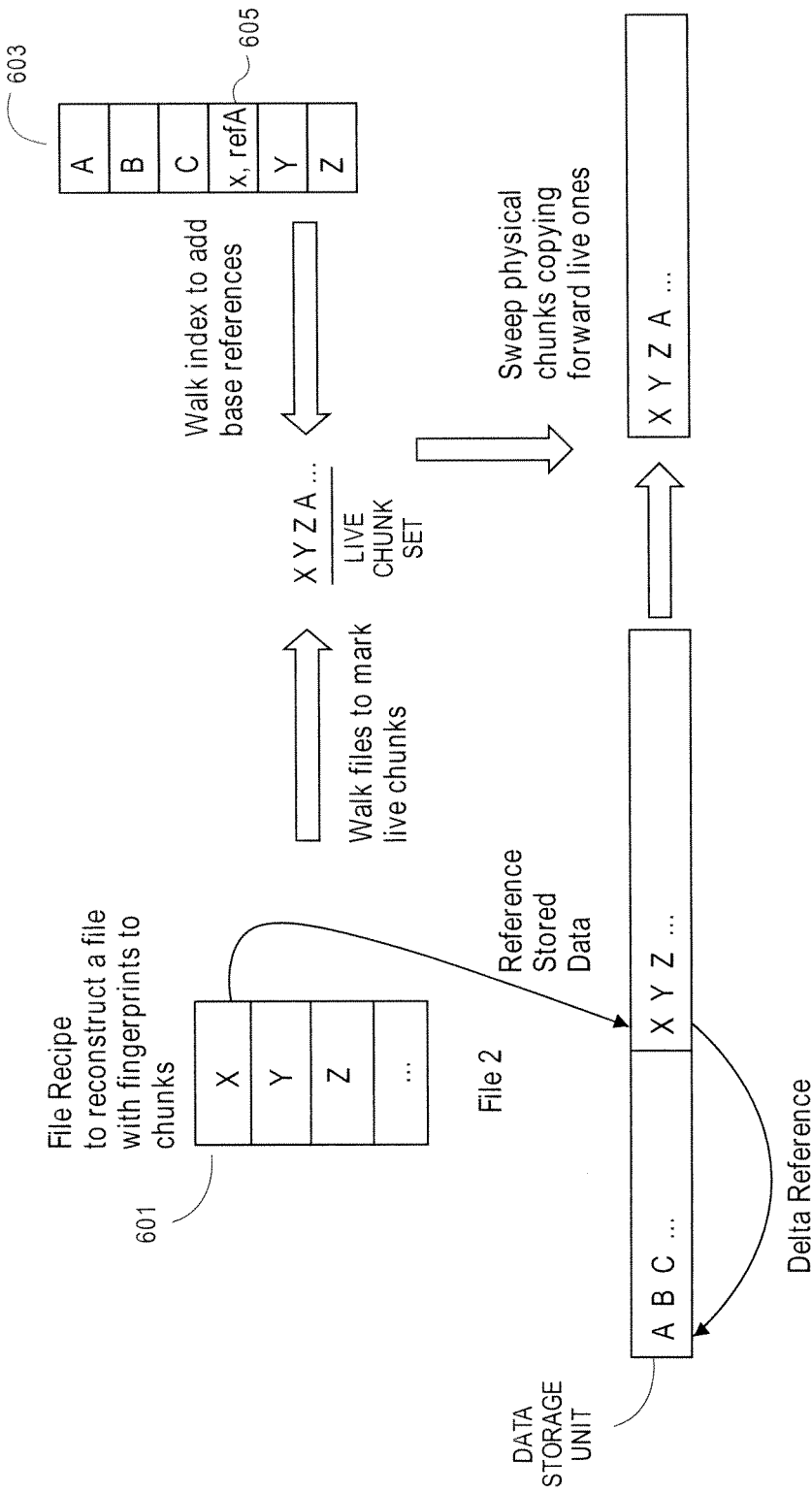
FIG. 6 is a diagram of one embodiment of a garbage collection process where references to base chunks are maintained in an index.
Figure 9:
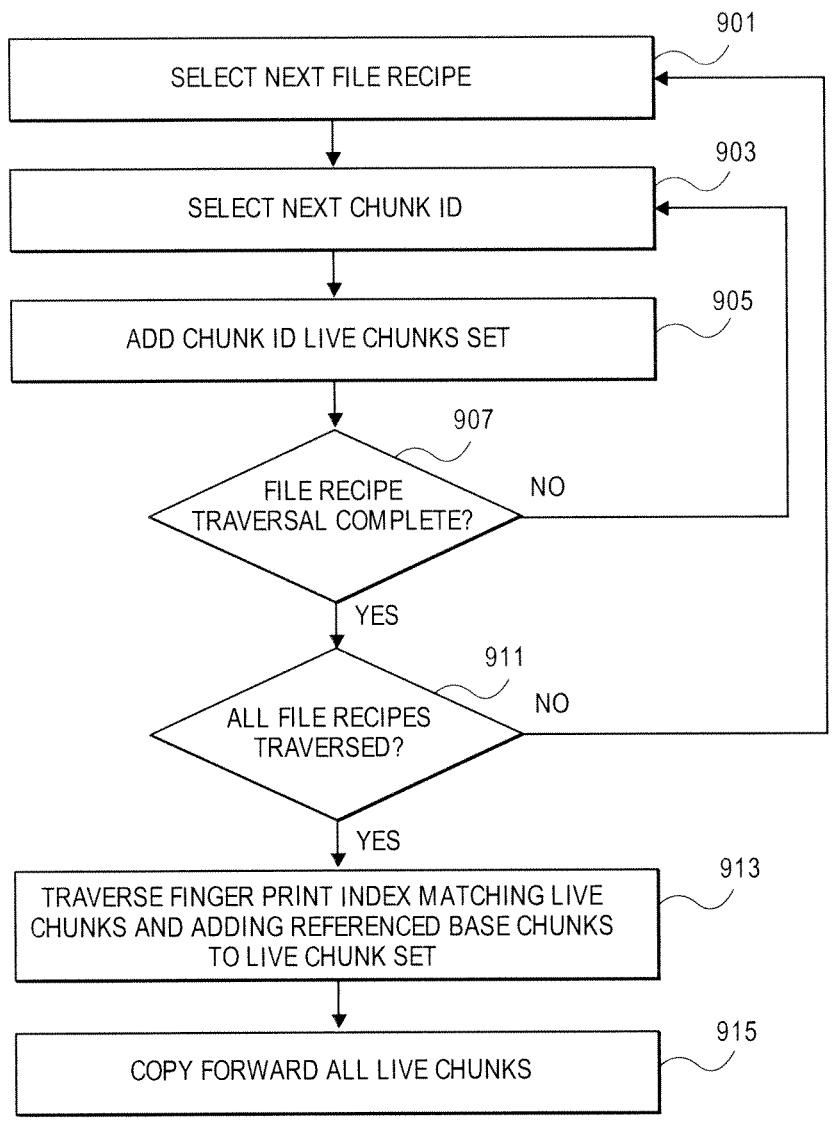
FIG. 9 is a flowchart of one embodiment of a garbage collection process where references to base chunks are maintained in the index.

FIG. 6 is a diagram of one embodiment of a garbage collection process where references to base chunks are maintained in an index. FIG. 9 is a flowchart of one embodiment of a garbage collection process where references to base chunks are maintained in the index. These figures are discussed in conjunction with one another to illustrate an example application (FIG. 6) of the general process (FIG. 9).

In one example embodiment, the garbage collection process utilizes delta reference information stored in the index. The file recipe 601 includes a list of data chunks (e.g., X, Y and Z) that form the file where each data chunk is identified by an address, fingerprint or similar information. The file recipe may or may not indicate whether any data chunk is delta encoded. The index 603 contains a set of entries that correlate each data chunk with a location in a data storage unit. In one embodiment, a set of entries (e.g., entry 605) in the index 603) include delta reference information. In the illustrated example, entry 605 is for data chunk X and includes its delta reference refA.

During the garbage collection process, the garbage collection module traverses or 'walks' each file recipe. A next file recipe is selected to process (Block 901) and it is traversed serially or in parallel with regard to other file recipes. The process traverses a file recipe by selecting the next data chunk identifier in the file recipe (Block 903) and adding the data chunk identifier to a live chunk list (Block 905). In the illustrated example, the file recipe includes references to data chunks X, Y and Z, which are each added to a live chunk set. In this example, the data chunk X is delta encoded and the delta reference is included with the index entry data. In one embodiment, when the file recipe is traversed the index for each data chunk is examined to identify whether a delta reference is included when the data chunk has been delta encoded (Block 913). For example, the data chunk X is stored as a delta encoding that utilizes a base chunk A. The illustration shows that the reference to the stored data chunk X in the data storage unit references the base chunk A. This delta reference can be found in the index then added to the live chunk set. In another embodiment, the index is traversed independently and after all file recipes have been enumerated, and each delta reference associated with a live chunk found therein is added to the live chunk set. In the chunk by chunk index checking embodiment, the process continues until all data chunks in a file recipe have been examined (Block 907) and all file recipes have been traversed (Block 911). In the independent index traversal embodiment, the fingerprint index is traversed to index match live chunks and to add delta referenced base chunks to the live chunk set after file recipe traversal completes (Block 907) and all file recipes have been traversed (Block 911).

The live chunk set is utilized, in the example embodiment, to copy or sweep the live data chunks to a new location thereby freeing the prior data storage location (Block 915). The new storage location can utilize fewer resources if there were dead data chunks that were not copied forward with the live data chunks. This embodiment is presented by way of example and not limitation. One skilled in the art would understand that this embodiment can be used in combination with the other embodiments described herein above and below.

Figures 10, 11:
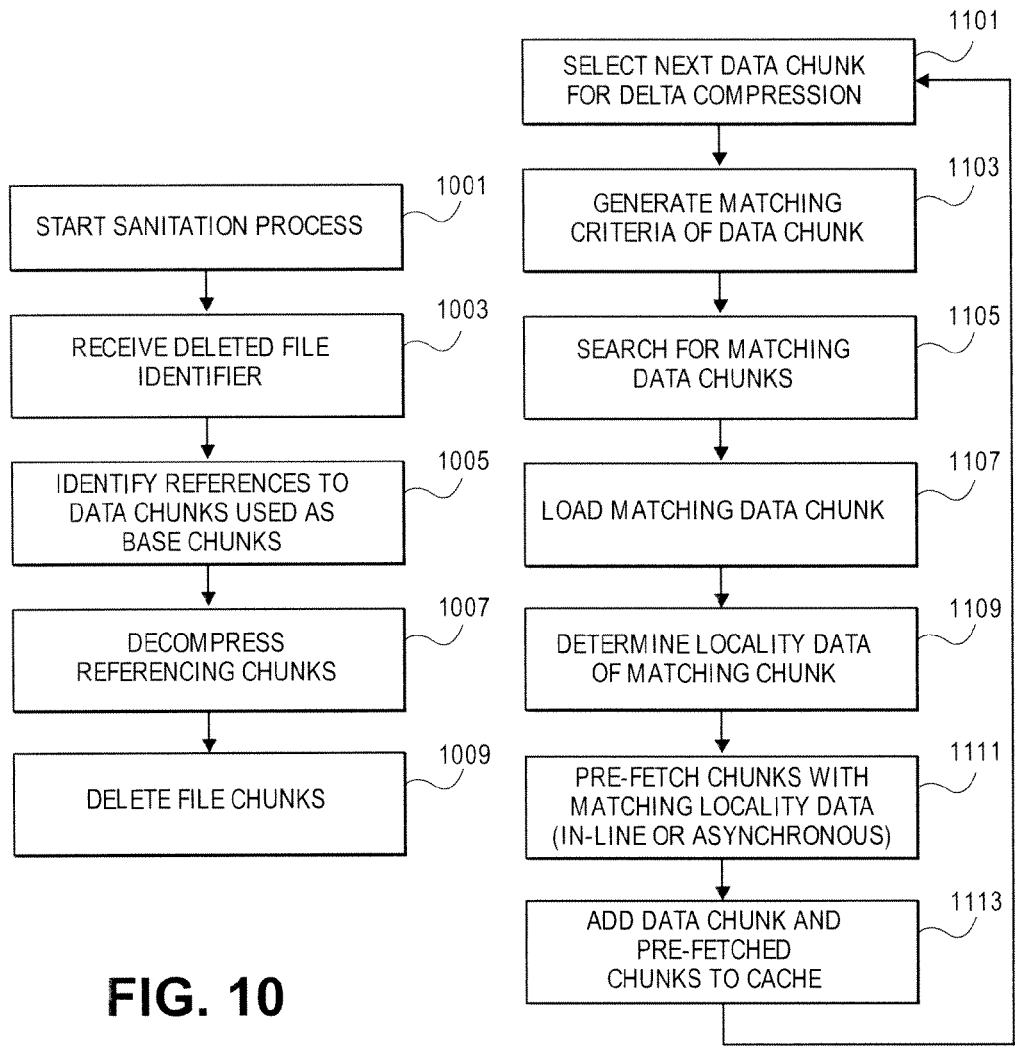
FIG. 10 is a flowchart of one embodiment of a sanitation process.
FIG. 11 is a flowchart of one embodiment of a data chunk pre-fetching process.

FIG. 10 is a flowchart of one embodiment of a sanitization process. In one embodiment, a sanitization process can be used in combination with the garbage collection process. In other embodiments, the sanitization process is independent of the garbage collection process. The process can be initiated during or after a garbage collection process, in response to the deletions or modification of a sensitive file or in similar circumstances (Block 1001). An identifier for a deleted file can be provided as an input or similarly received by the sanitization process (Block 1003).

The file descriptor can then be traversed to identify references to data chunks that serve as base chunks for delta encoded data chunks (Block 1005). It is assumed that the deletion process has removed any data chunks that do not serve as base chunks. Due to the sensitive information or rules governing a file it may be necessary to also ensure that all data chunks associated are deleted, a goal that could be frustrated by delta encoding schemes causing base chunks in the file to be preserved. Each of the data chunks referencing the base chunk in the deleted file (i.e., referencing a dead base chunk) can be decompressed using the base chunk thereby reversing the delta encoding of the referencing data chunk (Block 1007). The base chunk of the deleted file can then be safely deleted without loss of data to other files and data chunks referencing the data chunks of the deleted file as base chunks (Block 1009).

FIG. 11 is a flowchart of one embodiment of a data chunk pre-fetching process. In one embodiment, a pre-fetching process is utilized to load a set of data chunks into a cache or similar storage location with faster access times in anticipation of utilization of at least some of the data in the set of pre-fetched data chunks. In one embodiment, this process is executed during a delta compression process as a data chunk is selected from a set of data chunks to be delta compressed and a set of already stored data chunks are retrieved for possible use as base chunks in the delta compression process.

The process can select and process data chunks serially or in parallel. The next data chunk to be delta compressed is selected (Block 1101). The data chunk is processed to determine a set of matching criteria such as a sketch or similar identifier to enable identification of candidates for serving as a base chunk in the delta compression process (Block 1103). The matching criteria are then utilized to search for the set of candidates for serving as a base chunk using metadata stored in an index of the stored data chunks or similar resource (Block 1105). In one embodiment, a subset of the index stored in the working memory or cache is searched and other portions of the index stored are loaded into the faster access working memory or cache in accordance with processes and systems discussed herein above and below. A matching data chunk or set of data chunks are loaded from the data storage unit and one is selected to serve as the base chunk (Block 1107).

The data chunk selected to serve as the base chunk is then analyzed to determine a set of locality data for the base chunk (Block 1109). The locality data can be any type of data utilized to identify similar data to be pre-fetched. The locality data can be location data (e.g., addresses or address ranges, container information, data storage unit information, data stream location information or similar information about the storage location of the base chunk. The locality data can also encompass information relating the characteristics of the base chunk including the type, organization or form of data stored in the chunks, temporal information related to the chunk (e.g., chunks written at approximately the same time), file locality (e.g., chunks written in preceding versions of a file or similar files), co-location (e.g., in the same container or similar data structure) or similar information. The locality data can then be utilize to search for and retrieve similar data chunks having matching or similar locality data (Block 1111). This process can be in-line or asynchronous with the general delta compression process. The data chunks with matching or similar locality data can then be loaded into a cache or similar storage structure with a fast access time (Block 1113). In one embodiment, the data chunks are loaded based on a set of references to the data chunks held in the queue, where the queue holds chunks or references to chunks that are being processed by any step described above or below. The availability of these data blocks increases the probability that subsequent data blocks to be delta compressed will find matching or similar data blocks in the cache rather than a slower data storage for use as base chunks in delta compression. The assumption is that subsequent blocks to be delta compressed with find similar matches as preceding data blocks, which are likely to be located proximate to the match of the preceding data block. In one embodiment, the pre-fetch process analyzes each data block for potential pre-fetch. In other embodiments, the process only evaluates periodically or in response to a cache miss for a data block.

Figure 12:
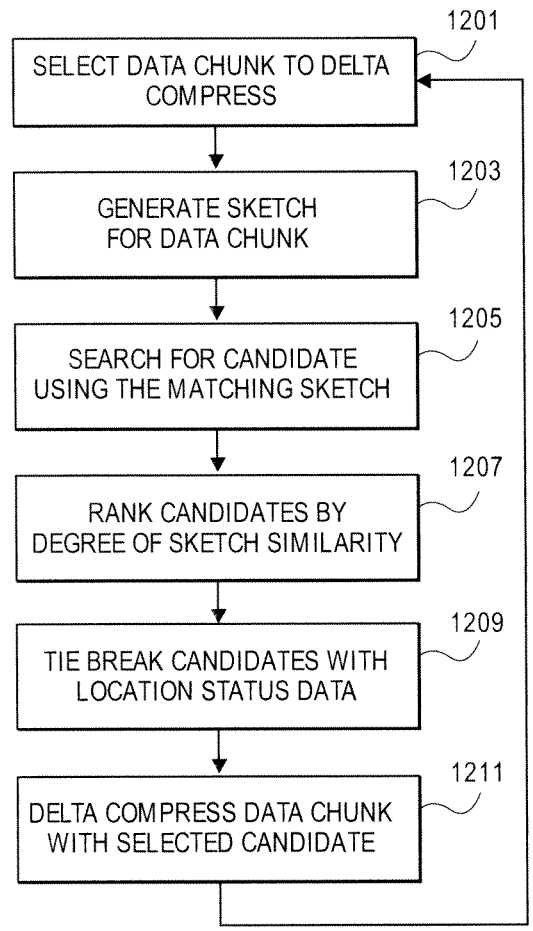
FIG. 12 is a flowchart of one embodiment of a data chunk selection process where candidates are ranked by sketches.

FIG. 12 is a flowchart of one embodiment of a data chunk selection process where candidates are ranked by sketches. In one embodiment, the delta compression system can factor in both the similarity and the location of a set of candidate data chunks to serve as a base chunk for a delta encoding of a data chunk. The process can be initiated in response to receiving data to delta encode, as a periodic process or under similar circumstances.

The process selects a next data chunk to be delta encoded (Block 1201). The selected data chunk is then analyzed to determine a set of similarity data by execution of a function such as a resemblance hash or similar function (Block 1203). The result, such as a sketch, can then be utilized to identify a set of possible candidate data blocks to serve as a base chunk (Block 1205) by using the sketch as a query against the index or similar data structure. The similarity or degree of match with the sketch can be based on a number of features within the sketch that match or based on similar measures of a degree of a match, which can be used to rank the candidates (Block 1207). The search for candidates can utilize an index or similar data structure that stores a sketch for each data block and enables a quick comparison of the degree of similarity between data blocks in the system.

Each of the candidates with at least one matching feature or degree of matching features can be ranked for possible consideration as a base chunk in the order of their degree of similarity with the selected data chunk (Block 1207). More than one of the data chunks could have the same degree of matching creating a tie as to which data block has a closest match with the data chunk to be encoded. In this case, location status information for each of the candidate data chunks can be considered to tie break. The location status information includes information about the factors that affect the speed at which a data chunk can be retrieved with the various statuses presenting information such as location of the data in a cache or a data storage unit, compression status and similar information. A candidate data chunk can then be selected based on the combination of the similarity ranking and a tie-break based on location status (Block 1209). The delta compression is then executed with the selected candidate (Block 1211), then committed to storage or transmitted. This selection process prioritizes compression, but where compression would be approximately the same elects to utilize a base chunk that can be loaded faster.

In a further embodiment, the process can monitor for whether any candidate data chunk meets a defined threshold for similarity, in which case the process can be halted and the candidate meeting the threshold can be selected for use as a base chunk. Such thresholds can also be used in combination with the dynamic candidate selection discussed below.

Figure 13:
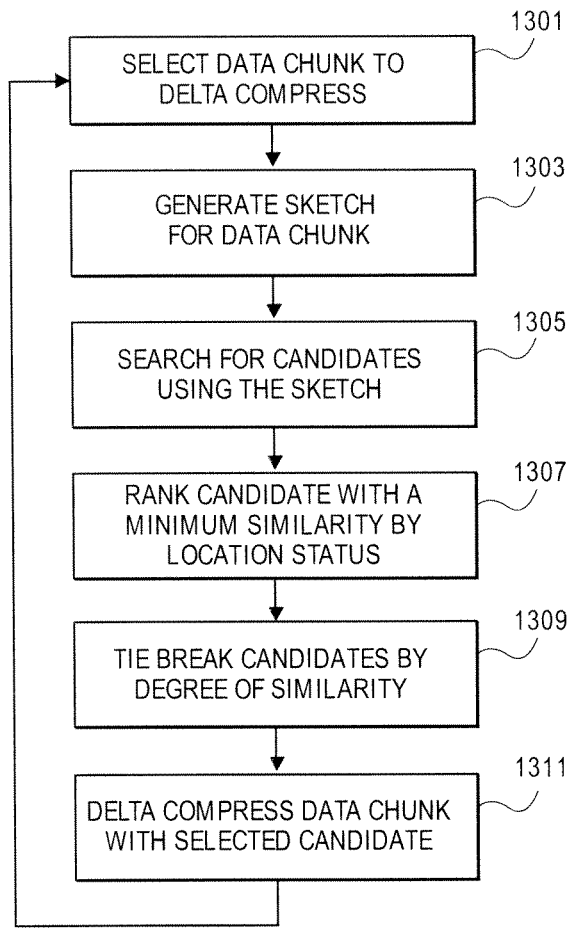
FIG. 13 is a flowchart of one embodiment of a data chunk selection process where candidates are ranked by location status.

FIG. 13 is a flowchart of one embodiment of a data chunk selection process where candidates are ranked by location status. In one embodiment, the data chunk selection process to identify base chunks is prioritized for speed over similarity that would provide higher levels of compression.

In this embodiment, the process selects a next data chunk to delta compress (Block 1301). The selected data chunk is then analyzed to determine a set of similarity data by execution of a function such as a resemblance hash or similar function (Block 1303). The result, such as a sketch, can then be utilized to identify a set of possible candidate data blocks to serve as a base chunk (Block 1305). The similarity or degree of match with the sketch can be based on a number of features within the sketch that match or based on similar measures of a degree of a match. The search for candidates can utilize an index or similar data structure that stores a sketch for each data block and enables a quick comparison of the degree of similarity between data blocks in the system.

Location status information for each candidate base chunk with at least one similar feature or a minimum degree of similarity can be determined. The location status information includes information about the factors that affect the speed at which a data chunk can be retrieved with the various statuses presenting information such as location of the data in a cache or a data storage unit, compression status and similar information. Each of the candidates with at least one matching feature or degree of matching features can be ranked for possible consideration as a base chunk in the order of their proximity in location status or fastest access time based on the location status (Block 1307). More than one of the data chunks could have the same proximity or access time creating a tie as to which data chunk can be loaded the fastest to be used for encoding. In the event of a tie, the degree of similarity to the selected data chunk can be utilized as a tie breaker (Block 1309). A candidate data chunk can then be selected based on the combination of the location status and similarity ranking and a tie-break based on similarity ranking (Block 1309). The delta compression is then executed with the selected candidate (Block 1311), then committed to storage or transmitted. This selection process prioritizes speed, but where speed would be approximately the same elects to utilize a base chunk that provides a better level of compression due to its higher similarity to the selected data chunk.

In a further embodiment, the process can monitor for whether any candidate data chunk meets a defined threshold for location status (e.g., an access time), in which case the process can be halted and the candidate meeting the threshold can be selected for use as a base chunk. Such thresholds can also be used in combination with the dynamic candidate selection discussed below.

Figure 14:
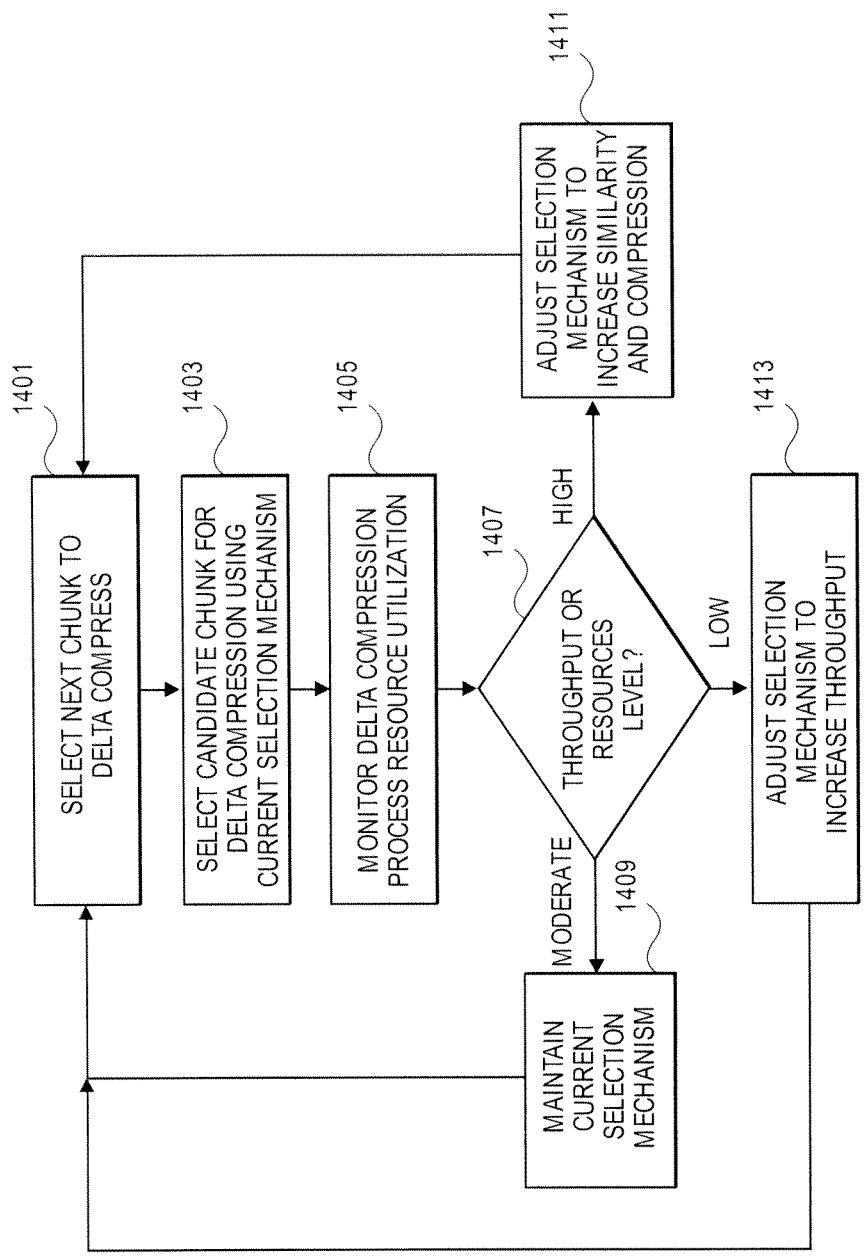
FIG. 14 is a flowchart of one embodiment of a process for dynamic data chunk selection process.

FIG. 14 is a flowchart of one embodiment of a process for dynamic candidate selection. In one embodiment, the process adjusts depending on resource availability to maintain a throughput to manage the incoming data chunks to be delta compressed. The process selects a next data chunk to delta compress (Block 1401). The process can utilize any selection mechanism for identifying candidate data chunks to serve as a base chunk such as the selection mechanisms described above in regard to FIGS. 12 and 13. The currently selected data chunk selection mechanism for identifying a base chunk is applied (Block 1403). This selected candidate can then be used for the delta compression of the selected data chunk. The process then continually monitors the available resources and throughput of the delta compression process (Block 1405).

The resource utilization and throughput is analyzed to determine whether a change in the current data chunk candidate selection process needs to be adjusted (Block 1407). This can be determined by checking a number of data chunks to be processed (e.g., in a queue of such data chunks), monitoring throughput rates and comparing with input rates and through similar direct and derived metrics. If the amount of resources available is high (and underutilized) and/or if the throughput is high, then the selection mechanism can be changed to utilize a selection mechanism that prioritizes similarity between the selected data chunk and the set of candidates to increase the degree of compression (block 1411). There may be any number of possible selection mechanisms available to be utilized in which case the dynamic process can incrementally adjust the selection mechanism until one end of the spectrum of selection mechanisms is reached.

If the resources available and/or throughput are low, the current selection mechanism can be adjusted to increase throughput by moving toward a selection mechanism that emphasizes location status and throughput over compression (Block 1413). In this regard, it is possible to completely disable delta compression if the resources are too low or throughput has fallen too far to enable the delta compression system to process the incoming data chunks. If however, the delta compression process is using a moderate amount of resources and/or generating a moderate output, the current selection mechanism may be maintained (Block 1409).

Figure 15:
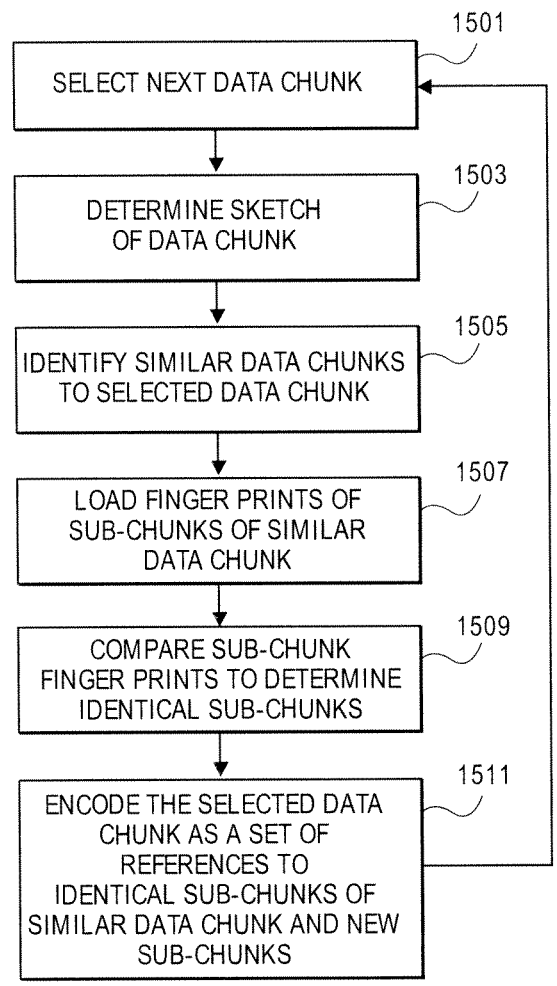
FIG. 15 is a flowchart of one embodiment of a process for sub-chunk data deduplication.
Figure 16:
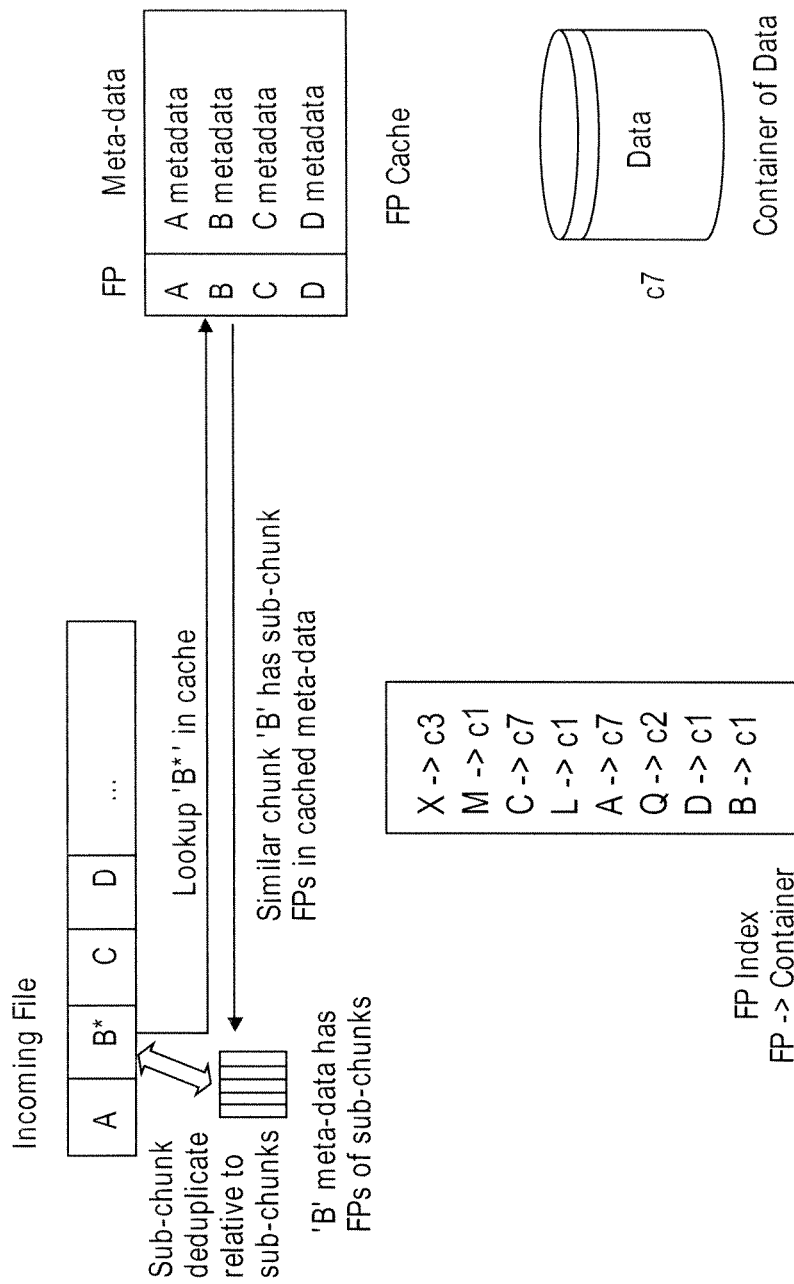
FIG. 16 is a diagram of one embodiment of a stage of a data deduplication process with sub-chunks.
Figure 17:
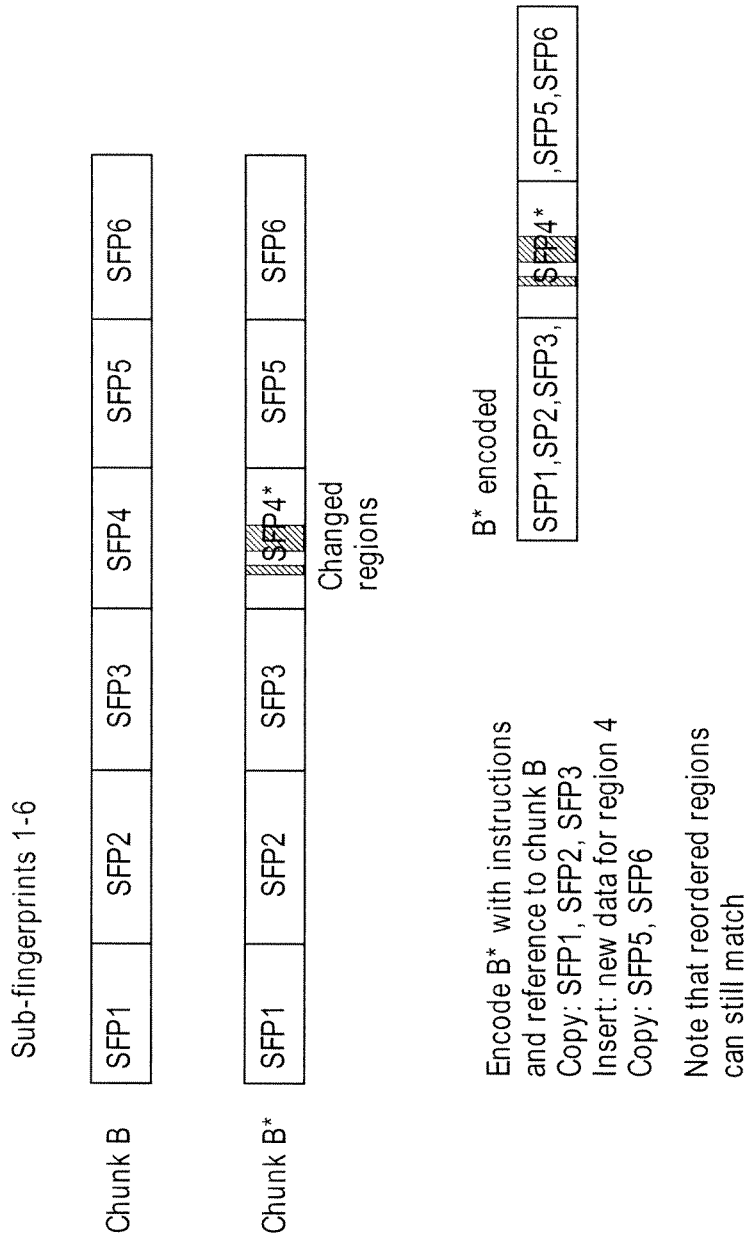
FIG. 17 is a diagram of one embodiment of a chunk encoding with sub-chunk data deduplication.

FIG. 15 is a flowchart of one embodiment of a process for sub-chunk deduplication. FIGS. 16 and 17 are diagrams of each stage of the sub-chunk deduplication process and are discussed in conjunction with the general process of FIG. 15. In one embodiment, sub-chunks and the metadata associated with them can be created at the time that data chunks are defined in the delta compression system. In other embodiments, the sub-chunks and their metadata are defined at a later point in the process or in a separate process. The process starts by selection of a next data chunk to process (Block 1501). In the illustrated example of FIG. 16, the selected data chunk is labeled B*. A sketch is made of the selected data chunk using a resemblance hash or similar process (Block 1503). The sketch is utilized to identify similar data chunks with matching or similar sketches (Block 1505). In the illustrated example of FIG. 16, the metadata of the chunks includes a sketch that is used to identify that data chunk B is similar to B*. The metadata also contains the fingerprints of the sub-chunks of data chunk B. The process loads the sub-chunk metadata of the similar chunk, in the example data chunk B (Block 1507). This metadata can be retrieved from the metadata of a container of the chunk.

The fingerprints of each of the sub-chunks are compared to fingerprints of the sub-chunks of the selected data chunk, in the example data chunks B* (Block 1509). The sub-chunks with matching fingerprints are encoded as references to the matching sub-chunks of the matching data chunk using the fingerprints of the matching sub-chunks (Block 1511). Those sub-chunks where there is not a match are stored as-is or delta encoded with a similar sub-chunk serving as the base sub-chunk. The matching and encoding is illustrated in FIG. 17 showing the organization of data chunk B and data chunk B* as well as the encoding of B*. In the example the sub-chunk SFP4 has no direct match because it contains changed data. Sub-chunks do not have to match in order of the base chunk's sub-chunks and can have varied order. Similarly, the size and organization of the sub-chunks can be fixed or variable and overlapping of sub-chunks is permissible in some embodiments. One skilled in the art would understand that any configuration of sub-chunks is compatible with the process and structures described herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present invention are not described with reference to any particular programming language. It will be appreciated that a variety of programming languages may be used to implement the teachings of embodiments of the invention as described herein.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A computer-implemented method for improving efficiency in a delta compression process in a data storage system, the method comprising:
    selecting a data chunk to delta compress;
    generating a sketch for the selected data chunk;
    searching for a set of candidate data chunks using the sketch;
    ranking the set of candidate data chunks by degree of sketch matching;
    tie-breaking the set of candidate data chunks, where the set of candidate data chunks has an equal degree of sketch matching, using location status data for each candidate data chunk, wherein the location status data indicates the location and status of the candidate data chunk and the location status data is at least one of a compressed in a cache status, a decompressed in a cache status, or a compressed in a data storage status, wherein tie-breaking the set of candidate data chunks prefers a decompressed in a cache status over a compressed in a cache status;
delta compressing the selected data chunk with a selected candidate data chunk; and
storing the delta compressed selected data chunk in the data storage system.

2. The method of claim 1, wherein generating the sketch further comprises: generating a set of features for the selected data chunk.

3. The method of claim 2, wherein searching for the set of candidate data chunks further comprises:
searching an index of data chunks to identify the set of candidate data chunks by comparing features in the index with the set of features of the selected data chunk.

4. The method of claim 1, wherein ranking the set of candidates data chunks by degree of sketch matching further comprises:
ranking the set of candidates by a number of matching features between a candidate and the selected data chunk.

5. The method of claim 1, wherein tie-breaking the set of candidate data chunks using location status data for each candidate prefers a compressed in a cache status over a compressed in a data storage status.

6. The method of claim 1, wherein tie-breaking the set of candidate data chunks using location status data for each candidate orders the set of candidate data chunks based on access times to retrieve each candidate data chunk.

7. A non-transitory computer-readable storage medium having instructions stored therein, which when executed by a computer, cause the computer to perform a method, the method for improving efficiency in a delta compression process, the method comprising:
selecting a data chunk to delta compress;
generating a sketch for the selected data chunk;
searching for a set of candidate data chunks using the sketch;
ranking the set of candidate data chunks by degree of sketch matching;
tie-breaking the set of candidate data chunks, where the set of candidate data chunks has an equal degree of sketch matching, using location status data for each candidate data chunk, wherein the location status data indicates the location and status of the candidate data chunk and the location status data is at least one of a compressed in a cache status, a decompressed in a cache status, or a compressed in a data storage status, wherein tiebreaking the set of candidates data chunks prefers a compressed in a cache status over a compressed in a data storage status;
delta compressing the selected data chunk with a selected candidate data chunk; and
storing the delta compressed selected data chunk in a data storage system.

8. The non-transitory computer-readable storage medium of claim 7, wherein generating the sketch further comprises:
generating a set of features for the selected data chunk.

9. The non-transitory computer-readable storage medium of claim 8, wherein searching for the set of candidate data chunks further comprises:
searching an index of data chunks to identify the set of candidate data chunks by comparing features in the index with the set of features of the selected data chunk.

10. The non-transitory computer-readable storage medium of claim 7, wherein ranking the set of candidates data chunks by degree of sketch matching further comprises: ranking the set of candidates by a number of matching features between a candidate and the selected data chunk.

11. The non-transitory computer-readable storage medium of claim 7, wherein tiebreaking the set of candidate data chunks using location status data for each candidate prefers a decompressed in a cache status over a compressed in a cache status.

12. The non-transitory computer-readable storage medium of claim 7, wherein tiebreaking the set of candidate data chunks using location status data for each candidate orders the set of candidate data chunks based on access times to retrieve each candidate data chunk.

13. A delta compression system, comprising:
a delta processing module to delta compress a first set of data chunks; and
a cache to store a second set of data chunks;
a data storage system to store a third set of data chunks;
a preferential selection module coupled to the cache, data storage system and delta processing module, the preferential selection module to identify a candidate to serve as a base chunk for delta compression by ranking a set of candidate base chunks from the second set of data chunks and third set of data chunks by similarity to a data chunk from the first set of data chunks then tie-breaking a ranked set of candidate data chunks, where the set of candidate data chunks has an equal degree of sketch matching, using location status information, wherein the location status data indicates the location and status of the candidate data chunk and the location status data is at least one of a compressed in a cache status, a decompressed in a cache status, or a compressed in a data storage status, wherein tie-breaking the set of candidate data chunks prefers a decompressed in a cache status over a compressed in a cache status.

14. The delta compression system of claim 13, wherein tie-breaking the set of candidate data chunks using location status data for each candidate prefers a compressed in a cache status over a compressed in a data storage status.

* * * * *